US 6,617,860 B2

(12) United States Patent
Uesaka et al.

(10) Patent No.: US 6,617,860 B2
(45) Date of Patent: *Sep. 9, 2003

(54) APPARATUS AND METHOD FOR DETECTING ELECTROMAGNETIC WAVE SOURCE, AND METHOD FOR ANALYZING THE SAME

(75) Inventors: Kouichi Uesaka, Kawasaki (JP); Kenichi Shinbo, Yokohama (JP)

(73) Assignee: Hitachi, Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/145,803

(22) Filed: May 16, 2002

(65) Prior Publication Data

US 2002/0153904 A1 Oct. 24, 2002

Related U.S. Application Data

(63) Continuation of application No. 09/553,319, filed on Apr. 20, 2000, now Pat. No. 6,411,104.

(30) Foreign Application Priority Data

Apr. 23, 1999 (JP) ............................................ 11-117028

(51) Int. Cl.[7] .............................................. G01R 31/02
(52) U.S. Cl. ..................................... 324/633; 324/631
(58) Field of Search .......................... 324/95, 627, 633, 324/72.5, 360, 631, 240, 244, 239, 158.1, 703; 340/600; 342/360; 343/703; 438/31, 35, 487, 676, 707, 776

(56) References Cited

U.S. PATENT DOCUMENTS

| 4,713,768 A | 12/1987 | Kosaka et al. |
| 5,300,879 A | 4/1994 | Masuda et al. |
| 5,311,116 A | 5/1994 | Rogers |
| 5,414,366 A | 5/1995 | Rogers |
| 5,585,722 A | 12/1996 | Hosoki et al. |
| 5,656,932 A | 8/1997 | Kitayoshi |
| 6,249,248 B1 | 6/2001 | Kitayoshi |
| 6,411,104 B1 * | 6/2002 | Uesaka et al. ............ 324/633 |

FOREIGN PATENT DOCUMENTS

| JP | 4329376 | 11/1992 |
| JP | 5281274 | 10/1993 |
| JP | 7181209 | 7/1995 |
| JP | 10142275 | 5/1998 |
| JP | 11133080 | 5/1999 |

OTHER PUBLICATIONS

J. Kikuchi et al., "A Proposal for Searching Electromagnetic Wave Sources by Using a Synthetic Aperture Technique", Oct. 1985, vol. J68–B, No. 10, pp. 1194–1201.
J. Kikuchi et al., "Search for Electromagnetic Wave Sources by Using the Maximum Entropy Method", Sep. 1986, vol. J69–B, No. 9, pp. 949–957.
S. Hayashi, "Electromagnetic Field Measuremen t and Numerical Analysis for EMC Problems", NEC, vol. 46, No. 9, 1993, pp. 50–54.

* cited by examiner

Primary Examiner—Kamand Cuneo
Assistant Examiner—Trung Q. Nguyen
(74) Attorney, Agent, or Firm—Antonelli, Terry, Stout & Kraus,LLP

(57) ABSTRACT

An electromagnetic wave source detecting apparatus may include a plurality of probes for measuring intensities of an electric field or magnetic field generated from an object to be measured at each measuring position. Calculation means may calculate a phase difference or time difference between electric fields or magnetic fields associated with the probes from the electric field or magnetic field intensities measured by the individual plural probes. A position of an electromagnetic wave source existing in the measured object may be calculated and identified by using the phase difference or time difference thus calculated. A magnitude of a current existing in the electromagnetic wave source at the position thus calculated may be identified on the basis of the electric field or magnetic field intensities thus measured.

18 Claims, 6 Drawing Sheets

APPARATUS AND METHOD FOR DETECTING ELECTROMAGNETIC WAVE SOURCE, AND METHOD FOR ANALYZING THE SAME

This application is a Rule 53(b) continuation of U.S. application Ser. No. 09/553,319, filed Apr. 20, 2000 now U.S. Pat. No. 6,411,104, the subject matter of which is incorporated herein by reference.

BACKGROUND OF THE INVENTION

The present invention relates to apparatus and method for detecting an electromagnetic wave source which can detect and identify the position of the source of an unwanted electromagnetic wave (electromagnetic disturbing wave) in an electronic apparatus such as a product mounting various kinds of electronic parts on a printed board, as well as system and method for analyzing an electromagnetic wave source which can analyze whether the standards of VCCI (Voluntary Control Council for Interference by Information Technology Equipment) are satisfied.

Electromagnetic interference due to an unwanted electromagnetic wave occurs frequently concomitantly with the recent widespread use of information communication apparatus and the like and therefore, in unwanted electromagnetic radiation suppressing technology, a technique has been required which can detect a source in order to suppress the unwanted electromagnetic wave (electromagnetic disturbing wave) which is the cause of the electromagnetic interference.

Exemplified as conventional techniques concerning the method for detection of an electromagnetic wave source are "A Proposal for Searching for Electromagnetic Wave Sources by Using a Synthetic Aperture Technique" by Junichi Kikuchi et al, Transactions of the Institute of Electronic Information and Communication Engineers of Japan, B-II, October 1985 (prior art 1), "Search for Electromagnetic Wave Sources by Using Maximum Entropy Method" by Junichi Kikuchi et al, Transactions of the Institute of Electronic Information and Communication Engineers of Japan, B-II, September 1986 (prior art 2), "Electromagnetic Field Measurement and Numerical Analysis for EMC Problems" by Co-se Hayashi, NEC Techniques, September 1993 (prior art 3) and JP-A-4-329376 (prior art 4).

In the prior art 1, minute mono-pole antennas serving as electric field probes are arrayed along a Cartesian coordinate system on a plane at intervals of about ¼ of the wavelength to obtain a result equivalent to the measurement of an unwanted electromagnetic wave using an aperture-front antenna equal to the array area. A position on the aperture front where an electromagnetic wave source exist is identified from a phase shift of the measured value and the operation time can be shorter than that in other techniques and values of both the magnitude and phase can be detected, but there arises a problem that the resolution is rough, amounting up to about ¼ of the wavelength.

In the prior art 2, the maximum entropy method is applied to time-series information of electromagnetic wave measured continuously for a constant time to provide a power spectrum which in turn is made to correspond to the position of an electromagnetic wave source in two-dimensional space. While the positional accuracy is high to advantage, there arise problems that measurement must continue for the constant time or more, phase information of the source cannot be detected and a remote field cannot be determined through calculation.

In the prior art 3, an electromagnetic wave source area is divided into minute gratings, simultaneous equations of current and magnetic field are set up by using the same number of measuring values as that of grating points and the equations are solved to identify the electromagnetic wave source position. Given that the electromagnetic wave source exists on the minute grating and the measuring value is stringently correct, the position can be obtained in the form of a point and true values of the magnitude and phase can be obtained. But, if at least one of the factors contains an error, then there will arise problems that the simultaneous equations do not converge and any solution cannot be obtained or quite an erroneous solution is calculated.

In the prior art 4, an electromagnetic field radiated from an electromagnetic radiation source is measured by a stationary reference antenna and a movable measuring antenna, the amplitude of an electromagnetic field received by the measuring antenna and the phase difference between electromagnetic fields measured by the reference antenna and measuring antenna are used to provide a presumptive expression concerning distribution of electromagnetic disturbing sources and the position of an electromagnetic disturbing source is presumed by a spatial differential value of the presumptive expression. Accordingly, there arises a problem that unless the number of measuring points measured by the measuring antenna is considerably large, a point where the spatial differential value becomes large cannot be found and the accuracy of presumption is degraded.

The present invention contemplates solving the above problems and an object of the present invention is to provide electromagnetic wave sources detecting apparatus and method which can detect and identify a source of unwanted electromagnetic wave (electromagnetic disturbing wave) existing at an arbitrary position on an object to be measured with high accuracy and at a high rate by using a relatively small number of measuring points for the purpose of suppressing the electromagnetic field at a remote location from the apparatus.

Another object of the invention is to provide electromagnetic wave source analyzing system and method which can analyze and decide whether the measured object satisfies the VCCI standards.

Still another object of the invention is to provide electromagnetic wave source analyzing system and method which can survey factors of a source of unwanted electromagnetic wave (electromagnetic disturbing wave) detected on the measured object.

SUMMARY OF THE INVENTION

To accomplish the above objects, an electromagnetic wave source detecting apparatus according to the invention comprises a plurality of probes for measuring intensities Hm (inclusive of phase data) of an electromagnetic field generated from an object to be measured of an electronic apparatus at each measuring position ($x_m$, $y_m$) which changes two-dimensionally along a measured object plane near the measured object, and calculation means for calculating a phase difference $\Delta\phi_m = (\phi_2 - \phi_1)_m$ or time difference $\Delta t_m = (t_2 - t_1)_m$ between magnetic fields associated with the probes from the electromagnetic field intensities Hm measured by the individual plural probes at each measuring position ($x_m$, $y_m$), calculating a difference d between distances from a presumptive electromagnetic wave source on the basis of the phase difference or time difference calculated at each measuring position, determining a locus of the presumptive electromagnetic wave source on the measured object plane from the distance difference d and geometrical relations (for example, $z_1$, $z_2$) of the plurality of probes to the measured object and detecting an intersection of loci of the presumptive electromagnetic wave source which are determined at a plurality of measuring positions to calculate and identify a position $(x_s, y_s)_n$ of an electromagnetic wave source existing in the measured object.

Further, an electromagnetic wave source detecting apparatus according to the invention comprises a plurality of probes for measuring intensities Hm (inclusive of phase data) of an electromagnetic field generated from an object to be measured of an electronic apparatus at each measuring position (xm, ym) which changes two-dimensionally along a measured object plane near the measured object, and calculation means for calculating a phase difference $\Delta\phi_m = (\phi_2 - \phi_1)_m$ or time difference $\Delta t_m = (t_2 - t_1)_m$ between magnetic fields associated with the probes from the electromagnetic field intensities Hm measured by the individual plural probes at each measuring position $(x_m, y_m)$, calculating a difference d between distances from a presumptive electromagnetic wave source on the basis of the phase difference or time difference calculated at each measuring position, determining a locus of the presumptive electromagnetic wave source on the measured object plane from the distance difference d and geometric relations (for example, $z_1$, $z_2$) of the plurality of probes to the measured object, detecting an intersection $(x_s, y_s)_n$ of loci of the presumptive electromagnetic wave source which are determined at a plurality of measuring positions to calculate and identify a position of an electromagnetic wave source existing inside the measured object, and further calculating magnitude In of current in the electromagnetic wave source existing at the identified position on the basis of the electromagnetic field intensities Hm measured by the probes at each measuring position.

Further, an electromagnetic wave source detecting apparatus according to the invention comprises a plurality of probes for measuring intensities Hm of an electromagnetic field generated from an object to be measured of an electronic apparatus at each measuring position $(x_m, y_m)$ which changes two-dimensionally along a measured object plane near the measured object, and calculation means for calculating a phase difference $\Delta 100 = (\phi_2 - \phi_1)_m$ or time difference $\Delta t_m = (t_2 - t_1)_m$ between magnetic fields associated with the probes from the electromagnetic field intensities Hm measured by the individual plural probes at each measuring position, calculating a difference d between distances from a presumptive electromagnetic wave source on the basis of the phase difference or time difference calculated at each measuring position, determining a locus of the presumptive electromagnetic wave source on the-measured object plane from the distance difference d and geometrical relations (for example, $z_1$, $z_2$) of the plurality of probes to the measured object, detecting an intersection $(x_s, y_s)_n$ Of loci of the presumptive electromagnetic wave source which are determined at a plurality of measuring positions to calculate and identify a position of an electromagnetic wave source existing inside the measured object, and further calculating magnitudes In of current distributions in a plurality of electromagnetic wave sources existing at individual plural positions identified similarly on the basis of the electromagnetic field intensities Hm measured by the probes at each measuring position.

Further, in the present invention, the plurality of probes in the electromagnetic wave source detecting apparatus are arranged on the same probe axis at the individual measuring positions.

Further, in the present invention, the plurality of probes in the electromagnetic wave source detecting apparatus are arranged on the same probe axis vertical to the measured object plane at the individual measuring positions $(x_m, y_m)$. In this case, the locus of the presumptive electromagnetic wave source on the measured object plane is indicated by a radius am.

Further, in the present invention, the calculation means of the electromagnetic wave source detecting apparatus further calculates inversely an electromagnetic field intensity En at a desired remote distance on the basis of the calculated magnitude of a current distribution in the electromagnetic wave source existing at the identified position on the measured object.

Further, in the present invention, the calculation means of the electromagnetic wave source detecting apparats inversely calculates an electromagnetic field intensity En at a desired remote distance on the basis of the calculated magnitude of a current distribution in each of the plurality of electromagnetic wave sources existing at each of the identified plural positions on the measured object.

Further, an electromagnetic wave source analyzing method according to the invention collates a position of an electromagnetic wave source existing on a measured object identified by using the aforementioned electromagnetic wave source detecting apparatus with mounting information (for example, circuit diagrams or mounting diagrams) of the measured object through, for example, display on a display unit. This permits electronic parts generating an unwanted electromagnetic wave (electromagnetic disturbing wave) to be ascertained.

Further, an electromagnetic wave source analyzing method according to the invention analyzes whether an electromagnetic field intensity at a desired remote distance calculated by using the electromagnetic wave source detecting apparatus satisfies the VCCI standards.

Further, an electromagnetic wave source detecting method according to the invention comprises measuring intensities Hm of an electromagnetic field generated from an object to be measured of an electronic apparatus at each measuring position $(x_m, y_m)$ which changes two-dimensionally along a measured object plane near the measured object by using a plurality of probes, calculating a phase difference $\Delta\phi_m = (\phi_2 - \phi_1)_m$ or time difference $\Delta t_m = (t_2 - t_1)_m$ between magnetic fields associated with the probes from the magnetic field intensities Hm measured at each measuring position $(x_m, y_m)$, calculating a difference d between distances from a presumptive electromagnetic wave source on the basis of the phase difference or time difference calculated at each measuring position, determining a locus of the presumptive electromagnetic wave source on the measured object plane from the distance difference d and geometrical relations (for example, $z_1$, $z_2$) of the plurality of probes to the measured object, and detecting an intersection $(x_s, y_s)_n$ of loci of the presumptive electromagnetic wave source which are determined at a plurality of measuring positions to calculate and identify a position of an electromagnetic wave source existing inside the measured object.

Further, an electromagnetic wave source detecting method according to the invention comprises measuring intensities Hm of an electromagnetic field generated from an object to be measured of an electronic apparatus at each measuring position $(x_m, y_m)$ which changes two-dimensionally along a measured object plane near the measured object by using a plurality of probes, calculating a phase difference $\Delta\phi_m = (\phi_2 - \phi_1)_m$ or time difference $\Delta t_m = (t_2 - t_1)_m$ between magnetic fields associated with the probes from the electromagnetic field intensities Hm measured at each measuring position, calculating a difference d between distances from a presumptive electromagnetic wave source on the basis of the phase difference or time difference calculated at each measuring position, determining a locus of the presumptive electromagnetic wave source on the measured object plane from the distance difference d and geometrical relations (for example, $z_1$, $z_2$) of the plurality of probes to the measured object, detecting an intersection ($x_s$, $y_s$)$_n$ of loci of the presumptive electromagnetic wave source which are determined at a plurality of measuring positions to calculate and identify an electromagnetic wave source existing inside the measured object, and further calculating magnitude In of current in the electromagnetic wave source existing at the identified position on the basis of the electromagnetic field intensities measured by the probes at each measuring position.

As described above, with the construction as above, by approaching only magnetic field probes small enough not to disturb magnetic fields from the main body of the measuring apparatus to the measured object, the positions of electromagnetic wave sources existing at arbitrary positions on the measured object can be presumed from the phase information by reducing the number M of measuring points of magnetic field distribution without being affected by the influence of reflection to obtain the number N (=M) of the sources, thereby ensuring that the positions of the electromagnetic wave sources existing at the arbitrary positions can be presumed with high accuracy and at a high rate.

Further, with the above construction, it can be analyzed and decided whether the measured object satisfies the VCCI standards.

Further, with the above construction, factors (kinds of electronic parts) of the source of unwanted electromagnetic wave (electromagnetic disturbing wave) detected on the measured object can be surveyed.

DESCRIPTION OF THE EMBODIMENTS

Embodiments of electromagnetic wave source detecting apparatus and method as well as electromagnetic wave source analyzing system and method according to the present invention will be described with reference to FIGS. 1 to 6.

Figure 1:
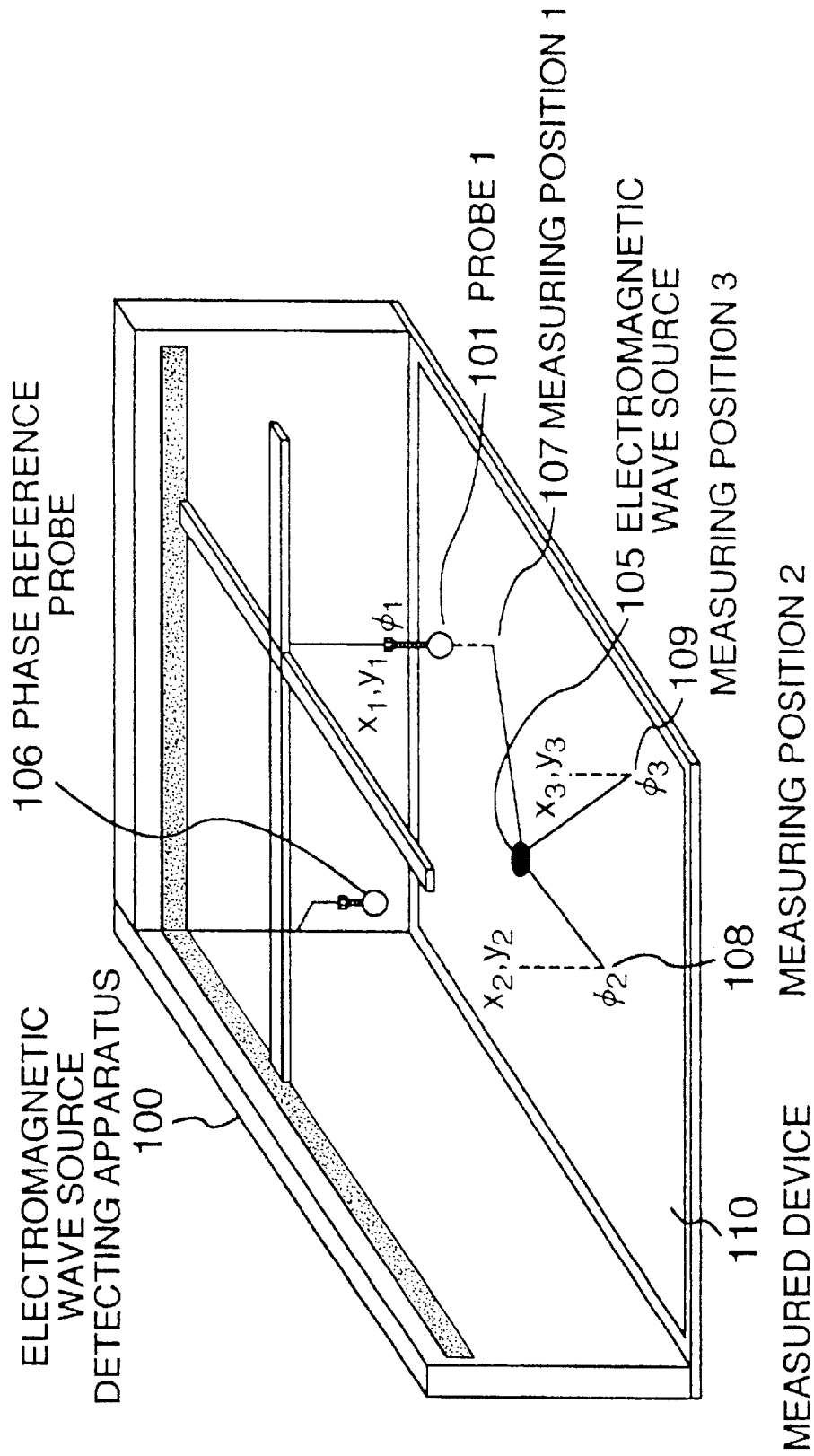
FIG. 1 is a perspective view showing an embodiment of an electromagnetic wave source detecting apparatus according to the invention.
Figure 2:
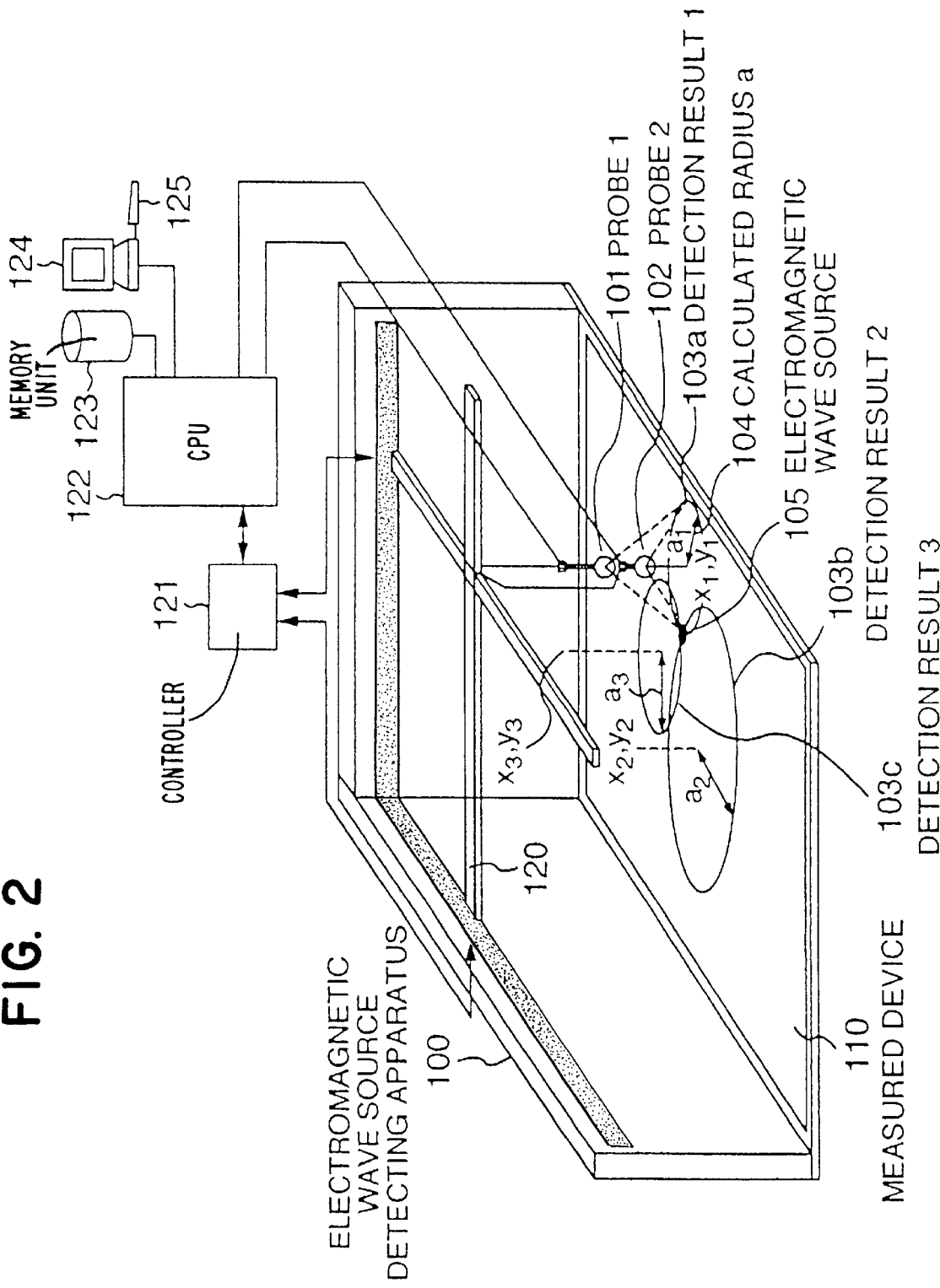
FIG. 2 is a schematic construction diagram showing an embodiment of electromagnetic wave source detecting apparatus and electromagnetic wave source analyzing system according to the invention.
Figure 3:
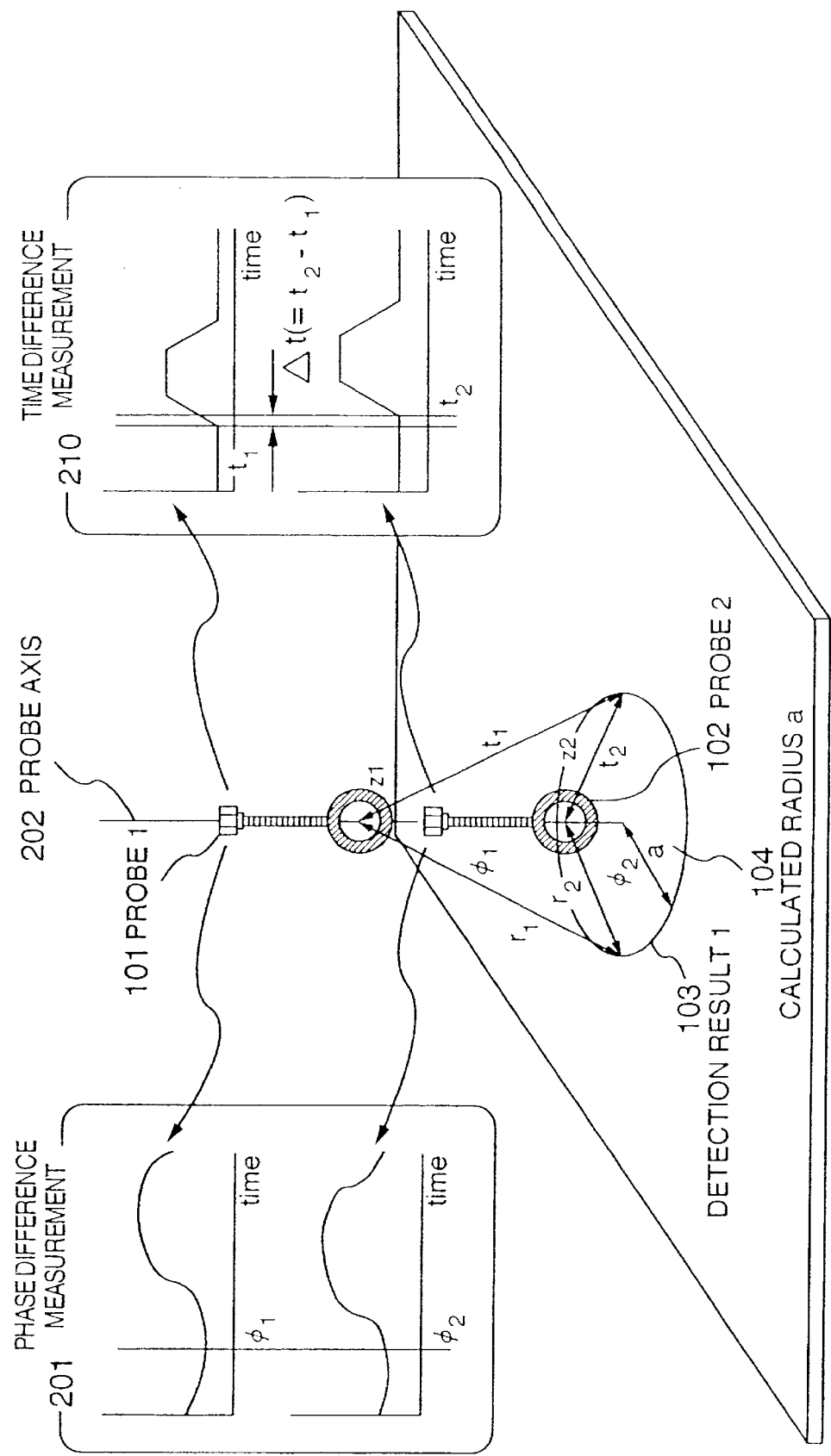
FIG. 3 is a diagram for explaining the outline of electromagnetic wave source detecting algorithm according to the invention.
Figure 4:
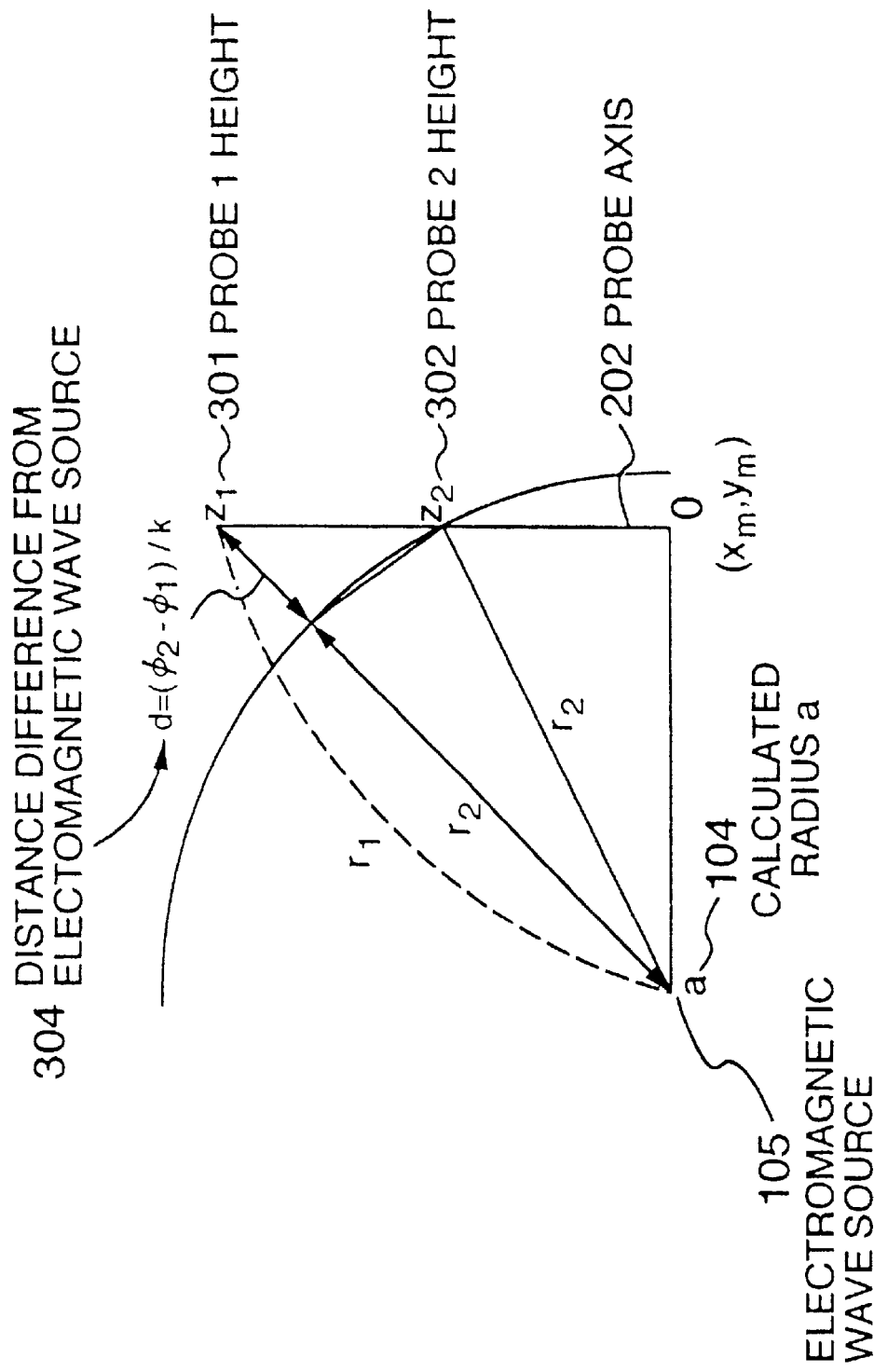
FIG. 4 is a partial explanatory diagram of the electromagnetic wave source detecting algorithm.

The electromagnetic wave source detecting apparatus and electromagnetic wave source analyzing system according to the invention are constructed as shown in FIGS. 1 and 2. FIG. 3 shows a conceptual diagram of electromagnetic wave source detecting algorithm according to the invention. FIG. 4 shows an explanatory diagram of details of the electromagnetic wave source detecting algorithm according to the invention.

As shown in FIG. 1, the electromagnetic wave source detecting apparatus 100 according to the invention has a probe 1 (101) and a phase reference probe 106 near a device to be measured (constructed by, for example, mounting various kinds of electronic parts on a printed board.) 110. Here, a phase $\phi1$ of a magnetic field measured at a measuring position 1 (107) of coordinates ($x_1$, $y_1$) determined by projecting the probe 1 (101) on the measured device 110 can be obtained as a phase difference relative to a magnetic field detected by the phase reference probe 106 provided at an arbitrary position.

From the phase $\phi1$ of the magnetic field, a phase $\phi2$ of the magnetic field at a measuring position 2 (108) of similarly determined coordinates ($x_2$, $Y_2$) and a phase $\phi3$ of the magnetic field at a measuring position 3 (109) of similarly determined coordinates ($x_3$, $y_3$), distances equal to the individual phase differences can be obtained and a sole point with respect of which the phase differences are generated can be obtained as a position of an electromagnetic wave source 105.

The above technique is more generalized to lead to an electromagnetic wave source detecting method based on phase detection which will be described with reference to FIG. 2.

As shown in FIG. 2, in the electromagnetic wave source detecting apparatus 100 according to the invention, a main body of measuring apparatus constructed of the probes 1 (101) and 2 (102) is spaced apart from the measured device (constructed by, for example, mounting various electronic parts on a printed board.) 110 in order to decrease the influence of reflection and only magnetic field probes extending from the main body of measuring apparatus and being small enough not to disturb the magnetic field are positioned in close to the measured device 110. Namely, as shown in FIG. 4, in the electromagnetic wave source detecting apparatus 100, the probe 1 (101) and probe 2 (102) are disposed at distances 301 and 302 which are electromagnetically close to the measured device 110 (defined by a current distribution identifying plane 403 in FIG. 5.) at a point (defined for, for example, the probe 1 as a magnetic field distribution measuring point 402 ($x_m$, $y_m$) on a two-dimensional field distribution measuring plane 401 in FIG. 5.). The electromagnetic wave source detecting apparatus 100 further comprises a moving mechanism 120 for moving these probe 1 (101) and probe 2 (102) to the magnetic field distribution measuring point 402 ($x_m$, $y_m$) and positioning them there, a controller 121 for controlling an actuator in the moving mechanism 120, a CPU 122 for identifying a position (current distribution identifying point 404) of the electromagnetic wave source 105 existing inside the measured object (measured device) 110 and calculating an electromagnetic field intensity at an arbitrary distance from the measured device, a display unit 124 for displaying the data as an output, input means 125 constructed of, for example, a recording medium, network or keyboard for inputting known data and information about mounting electronic parts in the measured device 110, and a memory unit 123 for storing various kinds of data and information. The controller 121 is so constructed as to deliver the position coordinates ($x_m$, $y_m$) of the magnetic field distribution measuring point 402 for the probe 1 (101) and probe 2 (102) to the CPU 122.

Incidentally, the probes 1 (101) and 2 (102) are for measurement of magnetic field and they can turn in individual x, y and z directions. They can otherwise be formed integrally. Namely, since magnetic fields $H_1$ and $H_2$ have each vector components, the probe 1 (101) is so constructed as to be able to detect x direction component $H_{1x}$, y direction component $H_{1y}$ and z direction component $H_{1z}$ and the probe 2 (102) is so constructed as to be able to detect x direction component $H_{2x}$, y direction component $H_{2y}$ and z direction component $H_{2z}$. Accordingly, by using these probes 1 (101) and 2 (102), phase difference measurement 201 as shown in FIG. 3 can be carried out near the measured device 110. Namely, with the respective probes 1 (101) and 2 (102), the magnetic field HI (having a phase of $\phi_1$) and magnetic field $H_2$ (having a phase $\phi_2$) from the measured object 110 which are expressed by the following equations (2) and (3) can be detected. Then, a phase difference $\Delta\phi_m=(\phi_2-\phi_1)_m$ can be calculated and measured by means of the CPU 122 and the like connected with the probes 1 (101) and 2 (102). Here, the magnetic fields existing in the space confining the individual probes can be expressed by the following equations (1) and (2).

$$H_1=f(I_1, r1)=|f(I_1, r_1)|e^{-jkr_1}=|H_1|e^{j\phi_1} \tag{1}$$

$$H_2=f(I_2, r_2)=|f(I_2, r_2)|e^{-jkr_2}=|H_2|e^{j\phi_2} \tag{2}$$

The phase difference $\Delta\phi_m=(\phi_2-\phi_1)_m$ can be determined by a wave number $k=2\pi/\lambda=2\pi f/c$ determined by a frequency f to be measured (especially, electromagnetic field intensity EdB$\mu$V generated at a frequency of 100 MHz to 1 GHz or more matters.) and distances $r_1$ and $r_2$ between the electromagnetic wave source 105 and the individual probes and can be expressed by the following equation (3), where c represents velocity of light (velocity of electromagnetic wave).

$$\Delta\phi_m=(\phi_2-\phi_1)_m=k(r_1-r_2) \tag{3}$$

Given that the difference between the distance $r_1$ from the electromagnetic wave source 105 to the probe 1 (101) and the distance $r_2$ from the electromagnetic wave source 105 to the probe 2 (102) is $d_m$ (303), the relation indicated by the following equation (4) stands.

$$(r_1-r_2)=(\phi_2-\phi_1)_m/k=\Delta\phi_m/k=d_m \tag{4}$$

Consequently, as shown in FIG. 4, a calculated radius a (104) from the point determined by projecting a probe axis 202 on the measured object 110 can be determined from a distance difference d which is calculated from the phase difference $\Delta\phi_m=(\phi_2-\phi_1)_m$ between the measured magnetic fields on the basis of the aforementioned equation (4) and can be expressed by a simple function as indicated by the following equation (5), where $z_1$ and $Z_2$ represent heights of the probes 1 (101) and 2 (102) from the measured device 110, respectively, and can be acquired via the controller 121 from the mechanism 120 for positioning the probes 1 (101) and 2 (102) in the height direction. Accordingly, the CPU 122 calculates the radius a (104) from the point determined by projecting the probe axis 202 on the measured object 110 and stores it, along with coordinate information $(x_m, y_m)$ of the probe axis 202, in the memory unit 123. The coordinate information $(x_m, y_m)$ of the probe axis 202 can of course be acquired, through the controller 121, from the mechanism 120 for two-dimensionally moving the probes 1 (101) and 2 (102) and positioning them.

$$a=\sqrt{\left(\frac{z_1^2-z_2^2-d^2}{2d}\right)^2-z_2^2} \tag{5}$$

Instead of calculating and measuring the phase difference $\Delta\phi_m=(\phi_2-\phi_1)_m$ on the basis of the magnetic fields $H_1$ and $H_2$ of the measured object detected by the respective probes 1 (101) and 2 (102) at the measuring position $(x_m, y_m)$, the CPU 122 may calculate and measure a time difference $\Delta t_m=(t_2-t_1)_m$ (time difference measurement 219) as shown in FIG. 3. More particularly, on the basis of the time difference $\Delta t_m=(t_2-t_1)_m$ between rise timings of time waveforms, fall timings of time waveforms or timing for exceeding a threshold and timing for falling below the threshold, the distance difference d (303) can be sought and determined from the relation indicated by the following equation (6). In the CPU 122, this is substituted to the equation (5) to seek and determine the distance difference d (104) between the position of the electromagnetic wave source 105 and the point determined by projecting the probe axis 202 on the measured object 110.

$$d_m=\Delta t_m \times c \tag{6}$$

where c represents the velocity of light (velocity of electromagnetic wave) which is a known value.

Gathering from the above results, the CPU 122 knows that the electromagnetic wave source 105 is on a circumferential locus (point-symmetrical to the probe axis 202.) 103 having a radius $a_1$ (104) centered on the point $(x_1, y_1)$ determined by projecting the probe axis 202 on the measured object 110. The CPU 122 stores, as a detection result 1 (103), the circumferential locus 103 on which the electromagnetic wave source 105 is presumed to exist in the memory unit 123. Further, similar measurement is carried out by changing the position of the probe axis 202 to $(x_2, y_2)$ and $(x_3, y_3)$ and the results (circumferential locus 103b of radius $a_2$ and circumferential locus 103c of radius $a_3$) are stored as detection results 2 (103b) and 3 (103c), respectively, in the memory unit 123. Then, the CPU 122 can determine and identify a position where the electromagnetic wave source 105 exists at a sole intersection of these circumferential loci 103, 103b and 103c. Given that the position of the probe axis 202 changes to coordinates $(x_2, y_2)$ and coordinates $(x_3, y_3)$ and radii are $a_2$ and $a_3$, the CPU 122 can calculate the intersection in terms of coordinates $(x_s, y_s)$ of the electromagnetic wave source 105 by solving the following equation (7).

$$(x_s-x_1)^2+(y_s-y_1)^2=a_1^2$$
$$(x_s-x_2)^2+(y_s-y_2)^2=a_2^2$$
$$(x_s-x_3)^2+(y_s-y_3)^2=a_3^2 \tag{7}$$

As described above, the CPU 122 can calculate and identify the position coordinates $(x_s, y_s)_n$ of the electromagnetic wave source 105 (current distribution identifying point 404) existing at an arbitrary position #N on the measured object 110 (current distribution identifying plane 403) and can store it in, for example, the memory unit 123.

Figure 5:
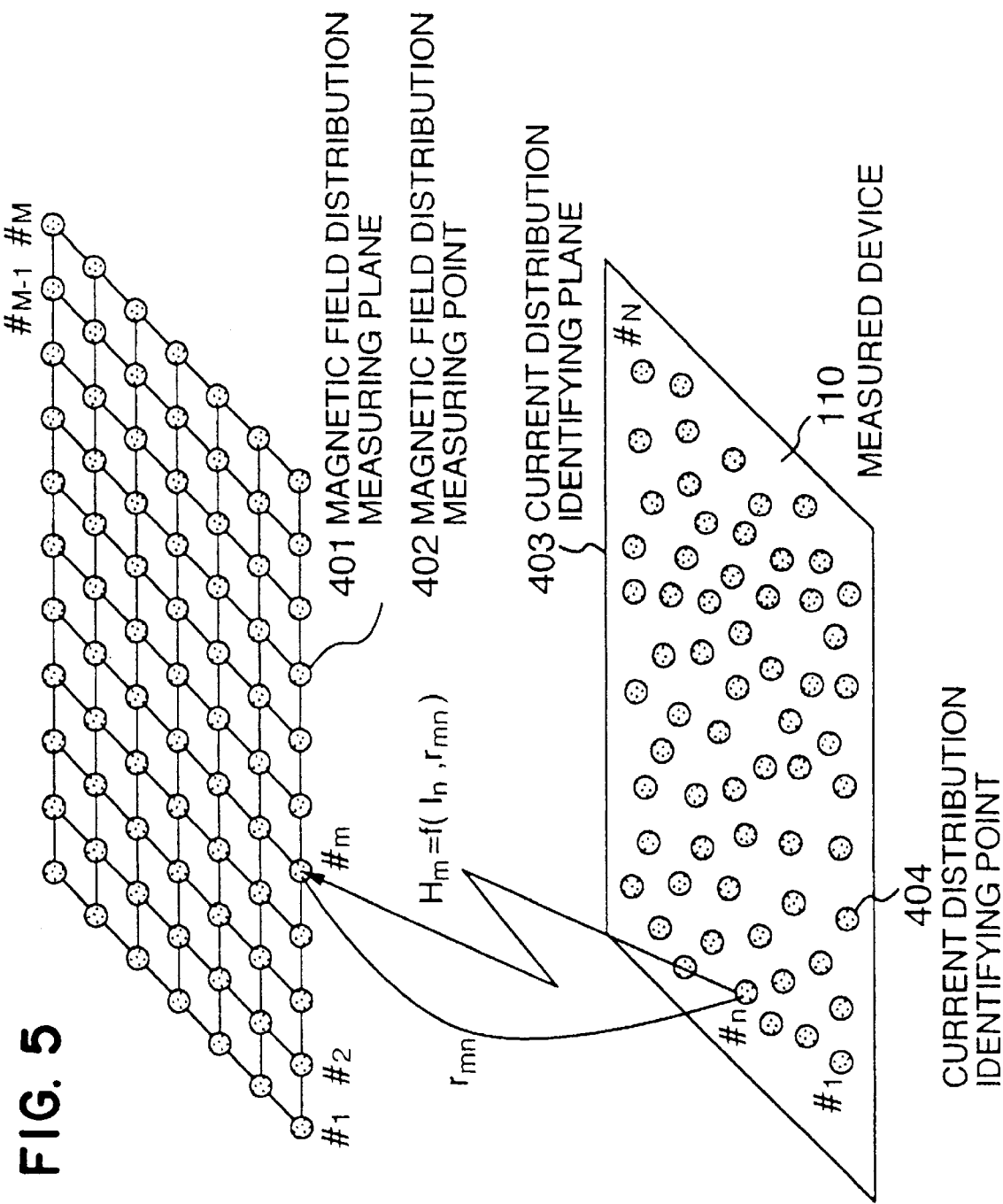
FIG. 5 is a diagram showing the concept of space for current distribution calculation according to the invention.

The above measurement is effected near the measured object 110 on the basis of a command from the CPU 122 by changing the probe axis 202 to a plurality of locations (indicated by #1 to #M in FIG. 5.), so that conditions of distribution of electromagnetic wave sources 105 (current distribution identifying points 404) existing at arbitrary positions on the measures object 110 (current distribution identifying plane 403) as shown in FIG. 5 can be known. The number N is made to be equal to the number M of these points.

Here, by holding intensity information Hm(M)=[Hmx(M), Hmy(M), Hmz(M)], along with phase information φm(M), in the memory unit 123 and by causing the CPU 122 to substitute magnetic field distribution measuring values Hm(M)=[Hmx(M), Hmy(M), Hmz(M)] of the same number as the number N of the current distribution identifying points 404 to the following equation (8), magnitude I=[Ix(N), Iy(N), Iz(N)] of a current distribution in the electromagnetic wave source 105 (current distribution identifying point 404) existing at an arbitrary position #N and phase φ(N) of the current can be calculated and stored in the memory unit 123. The current I(N) is related to the phase φ(N) by equation (9) as below.

$$\begin{pmatrix} Hm_x(M) \\ Hm_y(M) \\ Hm_z(M) \end{pmatrix} = \begin{pmatrix} Hx_x(M,N) & Hx_y(M,N) & Hx_z(M,N) \\ Hy_x(M,N) & Hy_y(M,N) & Hy_z(M,N) \\ Hz_x(M,N) & Hz_y(M,N) & Hz_z(M,N) \end{pmatrix} \cdot \begin{pmatrix} I_x(N) \\ I_y(N) \\ I_z(N) \end{pmatrix} \quad (8)$$

Since the coordinates (xm, ym) of #M at which the probe axis 202 is positioned, the height data of, for example, the probe 1 (101) (magnetic field distribution measuring plane 401) caused to approach the measured device 110 (current distribution identifying plane 403) and the position coordinates ($x_{sn}$, $y_{sn}$) of the electromagnetic wave source 105 (current distribution) existing at the arbitrary position #N calculated and identified as above are known, the CPU 122 can determine coefficients [Hx$_x$(M, N), Hx$_y$(M, N), Hx$_z$(M, N); Hy$_x$(M, N), Hy$_y$(M, N), Hy$_z$(M, N); Hz$_x$(M, N), Hz$_y$(M, N), Hz$_z$(M, N)]. Accordingly, by solving the aforementioned equation (8) on the basis of the measured magnetic field distribution measuring values Hm(M)=[Hmx(M), Hmy(M), Hmz(M)], the CPU 122 can calculate magnitude I=[Ix(N), Iy(N), Iz(N)] of the current distribution in the electromagnetic wave source 105 (current distribution identifying point 404) existing at the arbitrary position #N and phase φ(N) of the current.

$$I(N)=|I(N)|e^{j\phi(N)} \quad (9)$$

Figure 6:
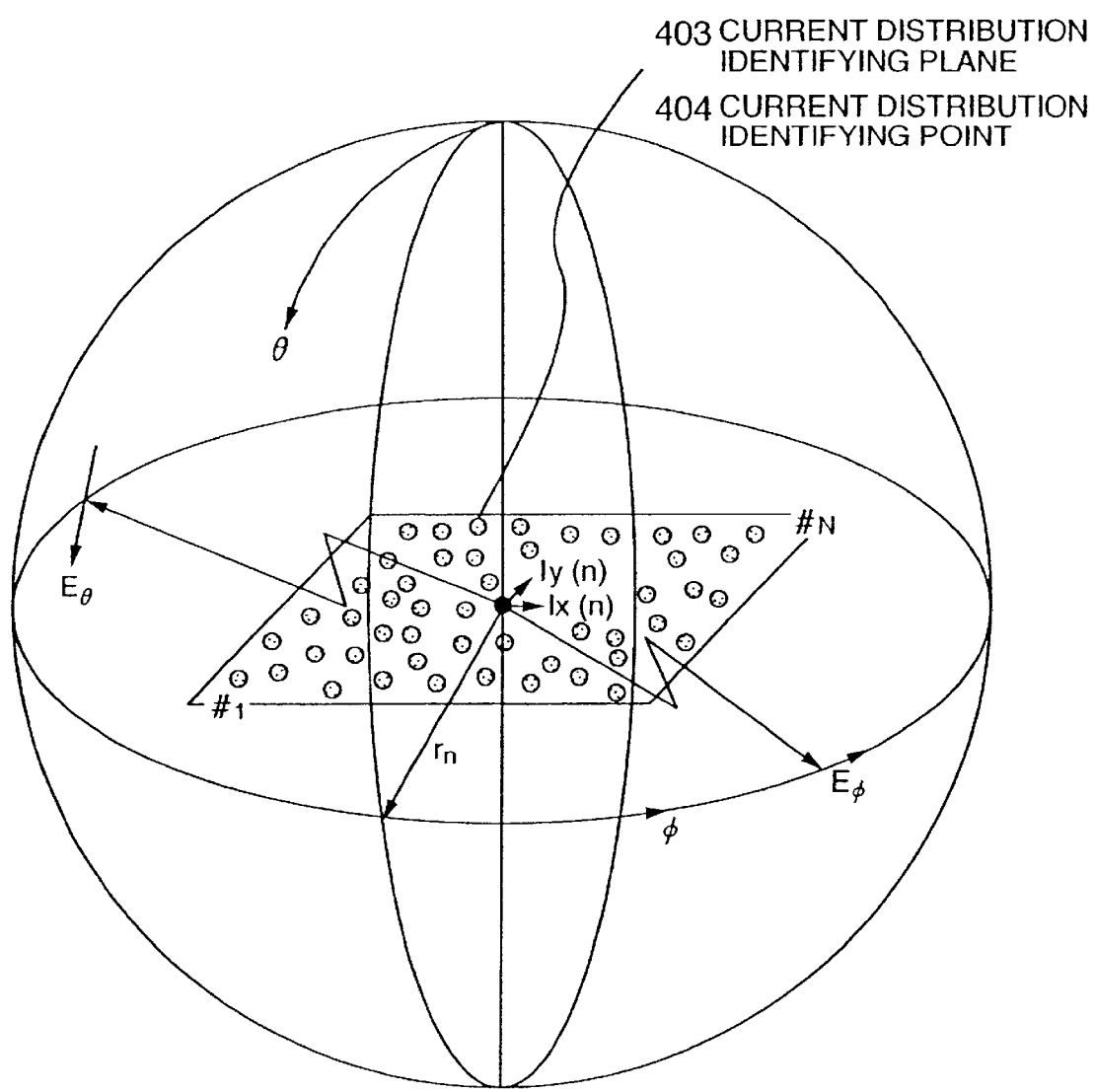
FIG. 6 is an explanatory diagram of calculation of remote electromagnetic field intensity according to the invention.

Further, as shown in FIG. 6, by calculating electromagnetic field intensity E(n)=[Eφ, Eθ] at an arbitrary distance (regulated distance)$r_n$ (distance regulated by VCCI (Voluntary Control Council for Interference by Information Technology Equipment)) from the measured object 110 pursuant to the following equation (10) on the basis of the current distribution [Ix(n), Iy(n), Iz(n)] calculated at the current distribution identifying point n, storing it in the memory unit 133 and delivering the stored electromagnetic field intensity E(n)=[Eφ, Eθ] at the regulated distance $r_n$ so as to display it on, for example, the display unit 124, the CPU 122 can compare the intensity with a regulated value of the VCCI. The equation (10) as below indicates electromagnetic field intensities (Eφ, Eθ) in φ direction and θ direction generated at the distance $r_n$ by the current (Ix(n), Iz (n)) flowing through minute lengths (dI$_{xn}$, dI$_{zn}$). Obviously, the CPU 122 may decide whether the electromagnetic field intensity E(n)=[Eφ, Eθ] at the calculated regulated distance $r_n$ meets the VCCI standards and deliver the result by using output means such as the display unit 124.

$$\begin{cases} E_\phi = \sum_{n=1}^{N} \frac{\eta}{2\lambda r_n}(-Ix(n) \cdot dl_{xn}\sin\phi + Iy(n) \cdot dl_{yn}\cos\phi \\ \qquad \left[1 + \left(\frac{1}{jkr_n} - \frac{1}{k^2 r_n^2}\right)\right] \cdot e^{-jkr_n} \\ E_\theta = \sum_{n=1}^{N} \frac{\eta}{2\lambda r_n}(Iz(n) \cdot dl_{zn}\sin\phi\left[1 + \left(\frac{1}{jkr_n} - \frac{1}{k^3 r_n^2}\right)\right] \cdot e^{-jkr_n} \end{cases} \quad (10)$$

where η=120π, λ=c/f, k=2π/λ, c: velocity of light.

In the above detecting method, a set of probes 1 (101) and 2 (102) arranged on the probe axis 202 is not always required to be arranged vertically to the measured object 110 as shown in FIGS. 2 to 4 but the probe axis 202 may be disposed obliquely to or laterally of the measured device (measured object) 110. In this case, in the calculation of the radius a (104) pursuant to the equation (5) and the calculation of the electromagnetic wave source 105 pursuant to the equation (7), the circular locus (point-symmetrical to the probe axis 202) of the radius a with respect to an axial direction vector (a vector oblique to or lateral of the measured object 110) of the probe set disposed on the probe axis 202 may be generalized to an elliptical locus or an oval locus obtained by projecting the circular locus on the plane of the measured device 110, and an intersection of these loci corresponding to the position at which the electromagnetic wave source 105 exists may be calculated.

Besides, when the probe 2 (102) is fixed at one point to serve as the phase reference probe as shown in FIG. 1, the position detecting method coincides with the method for detecting the position of the electromagnetic wave source based on the phase detection as explained in the beginning. But in this case, the calculation process becomes complicated and time-consuming and the accuracy is degraded.

Next, an embodiment will be described in which it is searched, on the basis of distribution conditions of the electromagnetic wave sources 105 (current distribution identifying points 404) identified on the measured device 110 (current distribution identifying plane 403) as described previously, what electronic parts the source is constructed of. In case the measured device 110 is constructed by, for example, mounting various kinds of electronic parts on a printed board, such CAD mounting information is inputted from a CAD system in advance by means of input means 125 constructed of a network or a recording medium and stored in the memory unit 123. Besides, an image obtained by actually photographing a product mounting various kinds of electronic parts on the printed board is inputted by means of the input means 125 constructed of a network or a recording medium and is stored in the memory unit 123. In this manner, mounting information (for example, circuit diagrams and mounting diagrams) of an electronic apparatus representing the measured object 110 is stored, as a file or an image, in the memory unit 123.

Then, by collating the position information of the identified electromagnetic wave source 105 (current distribution identifying point 404) with the precedently inputted mounting information of electronic apparatus for the measured object 110 on, for example, the screen of the display unit 124, the CPU 122 can search what factors (for example, kinds of electronic parts) the electromagnetic wave source is constructed of and as a result, measures (for example, alteration of design or exchange of parts) of, for example, weakening the generation of the electromagnetic wave can be applied.

Advantageously, according to the invention, an unwanted electromagnetic wave source existing at an arbitrary position on the measured object of electronic apparatus can be detected with high accuracy and at a high rate so as to be presumed.

Besides, according to the invention, by holding absolute value information during electromagnetic field measurement and substituting information of magnetic field distribution corresponding in number to the presumed electromagnetic wave sources to simultaneous equations, the position of the electromagnetic wave source on the measured object, along with the magnitude and phase of current, can be determined with high accuracy and at a high rate to advantage.

Further, according to the invention, by calculating an electromagnetic field intensity at an arbitrary remote distance from the measured object through the use of the position of the electromagnetic wave source on the measured object and information about the magnitude of current, a comparative decision as to whether the VCCI standards are satisfied can also be made.

Further, according to the invention, by permitting calculation of remote electromagnetic field intensity, an unwanted electromagnetic wave source can be detected within a short period and with high accuracy and as a result, measures against unwanted electromagnetic wave are not applied to a location where design quality does not matter and the efficiency of design can greatly be promoted to advantage.

What is claimed is:

1. An electromagnetic wave source detecting apparatus comprising:
   a plurality of probes for measuring intensities of an electric field or magnetic field generated from an object to be measured at each measuring position; and
   calculation means for calculating a phase difference or time difference between electric fields or magnetic fields associated with said probes from the electric field or magnetic field intensities measured by the individual plural probes, for calculating and identifying a position of an electromagnetic wave source existing in said measured object by using the phase difference or time difference thus calculated, and for calculating and identifying a magnitude of a current existing in the electromagnetic wave source at the position thus calculated on the basis of the electric field or magnetic field intensities thus measured.

2. The electromagnetic wave source detecting apparatus according to claim 1, wherein said calculation means further calculates and identifies a magnitude of a current distribution due to currents existing in a plurality of electromagnetic wave sources at each of individual plural positions identified similarly on the basis of the electric field or magnetic field intensities thus measured.

3. The electromagnetic wave source detecting apparatus according to claim 2, wherein said calculation means further calculates an electromagnetic wave intensity at a desired remote distance on the basis of the current distribution thus identified.

4. The electromagnetic wave source detecting apparatus according to claim 2, wherein analysis is performed as to whether or not the electromagnetic field intensity at the desired remote distance thus calculated satisfies VCCI standards.

5. The electromagnetic wave source detecting apparatus according to claim 2, further comprising means for collating the positions of the electromagnetic wave sources thus identified with mounting information of said measured object.

6. The electromagnetic wave source detecting apparatus according to claim 1, wherein said calculation means further calculates an electromagnetic wave intensity at a desired remote distance on the basis of the magnitude of the current thus identified.

7. The electromagnetic wave source detecting apparatus according to claim 6, wherein analysis is performed as to whether or not the electromagnetic field intensity at the desired remote distance thus calculated satisfies VCCI standards.

8. The electromagnetic wave source detecting apparatus according to claim 1, further comprising means for collating the position of the electromagnetic wave source thus identified with mounting information of said measured object.

9. An electromagnetic wave source analyzing system comprising an electromagnetic wave source detecting apparatus and a display device for displaying information related to an electromagnetic wave detecting apparatus, wherein said electromagnetic wave source detecting apparatus includes:
   a plurality of probes for measuring intensities of an electric field or magnetic field generated from an object to be measured at each measuring position; and
   calculation means for calculating a phase difference or time difference between electric fields or magnetic fields associated with said probes from the electric field or magnetic field intensities measured by the individual plural probes, and for calculating and identifying a position of an electromagnetic wave source existing in said measured object by using the phase difference or time difference thus calculated.

10. The electromagnetic wave source analyzing system according to claim 9, wherein said calculation means of said electromagnetic wave source detecting apparatus further calculates and identifies a magnitude of a current existing in the electromagnetic wave source at the position thus identified on the basis of the electric field or magnetic field intensities thus measured.

11. The electromagnetic wave source analyzing system according to claim 10, wherein said calculation means of said electromagnetic wave source detecting apparatus further calculates an electromagnetic wave intensity at a desired remote distance on the basis of the magnitude of the current thus identified.

12. The electromagnetic wave source analyzing system according to claim 11, wherein analysis is performed as to whether or not the electromagnetic field intensity at the desired remote distance thus calculated satisfies VCCI standards.

13. The electromagnetic wave source analyzing system according to claim 9, wherein said calculation means of said electromagnetic wave detecting apparatus further calculates and identifies a magnitude of a current distribution due to currents existing in a plurality of electromagnetic wave sources at each of individual plural positions identified similarly on the basis of the electric field or magnetic field intensities thus measured.

14. The electromagnetic wave source analyzing system according to claim 13, wherein said calculation means of said electromagnetic wave source detecting apparatus further calculates an electromagnetic wave intensity at a desired remote distance on the basis of the current distribution thus identified.

15. The electromagnetic wave source analyzing system according to claim 14, wherein analysis is performed as to whether or not the electromagnetic field intensity at the desired remote distance thus calculated satisfies VCCI standards.

16. The electromagnetic wave source analyzing system according to claim 9, wherein said display device displays positional information related to the electromagnetic wave source thus identified and mounting information of said measured object.

17. The electromagnetic wave source analyzing system according to claim 9, further comprising a storage device for storing circuit information or mounting information of said measured object.

18. The electromagnetic wave source analyzing system according to claim 9, further comprising a storage device for storing circuit information or mounting information of said measured object, wherein said display device displays positional information relating to the electromagnetic wave source thus identified and the mounting information of said measured object stored in said storage device.

\* \* \* \* \*